United States Patent
Pal et al.

(10) Patent No.: US 7,932,143 B1
(45) Date of Patent: Apr. 26, 2011

(54) METHODS FOR PROTECTING GATE STACKS DURING FABRICATION OF SEMICONDUCTOR DEVICES AND SEMICONDUCTOR DEVICES FABRICATED FROM SUCH METHODS

(75) Inventors: Rohit Pal, Fishkill, NY (US); Michael Hargrove, Clinton Corners, NY (US); Frank Bin Yang, Mahwah, NJ (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 12/604,281

(22) Filed: Oct. 22, 2009

(51) Int. Cl.
*H01L 21/8238* (2006.01)

(52) U.S. Cl. ........ 438/218; 438/197; 438/221; 438/294; 438/296; 257/E21.616; 257/E21.628; 257/E21.64; 257/E21.642

(58) Field of Classification Search .................. 438/197, 438/218, 221, 294, 296; 257/E21.616, E21.628, 257/E21.632, E21.64, E21.642
See application file for complete search history.

(56) References Cited

U.S. PATENT DOCUMENTS

| | | | |
|---|---|---|---|
| 7,098,515 B1 * | 8/2006 | Gu et al. ........................ | 257/397 |
| 7,105,908 B2 * | 9/2006 | Lee et al. ...................... | 257/510 |
| 2002/0135020 A1 * | 9/2002 | Skotnicki et al. .............. | 257/368 |
| 2004/0053457 A1 * | 3/2004 | Sohn .............................. | 438/197 |
| 2007/0128789 A1 * | 6/2007 | Lim et al. ...................... | 438/202 |
| 2010/0109056 A1 * | 5/2010 | Pal et al. ........................ | 257/288 |

* cited by examiner

*Primary Examiner* — Michael S Lebentritt
*Assistant Examiner* — Daniel Whalen
(74) *Attorney, Agent, or Firm* — Ingrassia Fisher & Lorenz, P.C.

(57) ABSTRACT

Methods for protecting gate stacks during fabrication of semiconductor devices and semiconductor devices fabricated from such methods are provided. Methods for fabricating a semiconductor device include providing a semiconductor substrate having an active region and a shallow trench isolation (STI) region. Epitaxial layer is formed on the active region to define a lateral overhang portion in a divot at the active region/STI region interface. A gate stack is formed having a first gate stack-forming layer overlying the semiconductor substrate. First gate stack-forming layer includes a non-conformal layer of metal gate-forming material which is directionally deposited to form a thinned break portion just below the lateral overhang portion. After the step of forming the gate stack, a first portion of the non-conformal layer is in the gate stack and a second portion is exposed. The thinned break portion at least partially isolates the first and second portions during subsequent etch chemistries.

17 Claims, 4 Drawing Sheets

-PRIOR ART-

-PRIOR ART-

METHODS FOR PROTECTING GATE STACKS DURING FABRICATION OF SEMICONDUCTOR DEVICES AND SEMICONDUCTOR DEVICES FABRICATED FROM SUCH METHODS

FIELD OF THE INVENTION

The present invention generally relates to methods for fabricating semiconductor devices and semiconductors fabricated from such methods, and more particularly relates to methods for protecting gate stacks during fabrication of semiconductor devices and semiconductor devices fabricated from such methods.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions.

There is a continuing trend to incorporate more and more circuitry on a single IC chip. To incorporate the increasing amount of circuitry, the size of each individual device in the circuit and the size and spacing between device elements (the feature size) must decrease. To achieve scaling of semiconductor devices, a variety of unconventional, sensitive, and/or "exotic" materials are being contemplated. High dielectric constant materials, also referred to as "high-k dielectrics," such as hafnium silicon oxynitride (HfSiON) and hafnium zirconium oxide (HfZrOx), among others, are considered for the 45 nm technology node and beyond to allow scaling of gate insulators. To prevent Fermi-level pinning, metal gates (MG) with the proper work function are used as gate electrodes on the high-k gate dielectrics. Such metal gate electrodes typically are formed of a metal gate-forming material such as lanthanum (La), aluminum (Al), magnesium (Mg), ruthenium (Ru), titanium-based materials such as titanium (Ti) and titanium nitride (TiN), tantalum-based materials such as tantalum (Ta) and tantalum nitride (TaN) or tantalum carbide ($Ta_2C$), or the like.

Typically during fabrication of a semiconductor device, the gate stack, comprising a gate insulator and a gate electrode, is exposed to liquid chemistries, such as solvents and/or aqueous solutions, used to remove disposable materials. For example, sulfur peroxide is commonly used during photolithography to strip photoresist from semiconductor substrates, ammonium peroxide is commonly used to clean materials of a semiconductor device, and hydrofluoric acid is commonly used as a pre-clean for metal silicide and to remove low temperature and other oxides. To protect the gate stack, particularly a gate stack comprising sensitive materials such as high-k dielectrics and metal gate-forming materials, a silicon nitride spacer is formed about sidewalls of the gate stack. However, depending on non-uniformities of the gate stack fabrication process or non-uniformities created during preparation of the semiconductor substrate prior to fabrication of the gate stacks, the silicon nitride spacer may not be adequate to protect the gate stack. For example, FIG. 1 is a cross-sectional view of gate stacks 10 overlying a semiconductor substrate 12. Each of the gate stacks comprises a first gate stack-forming layer 14. The first gate stack-forming layer 14 may comprise a combination of a gate insulator material and a metal gate-forming material. The gate insulator material may comprise a high-K dielectric. The gate stacks 10 further comprise a second gate stack-forming layer 16, such as, for example, polycrystalline or amorphous silicon. Prior to fabrication of the gate stacks 10, shallow trench isolation (STI) regions 18 are formed within the semiconductor substrate 12 to electrically isolate other regions of the semiconductor substrate. Typically, the STI regions are fabricated by forming a patterned hard mask, usually silicon nitride, over the semiconductor substrate 12, etching exposed regions of the substrate to form trenches, and depositing an insulating material such as silicon oxide in the trenches. The silicon oxide is subjected to planarization to expose the hard mask and the hard mask then is removed by exposure to a wet etch chemistry, such as a phosphoric acid and hydrofluoric acid etch. During exposure to the wet etch chemistry, the silicon oxide also is slightly etched laterally. This etching causes a "divot" or void 20 to be formed at the interface of the STI region 18 and active region of the semiconductor substrate 12. Accordingly, during fabrication of the gate stacks 10, the first gate stack-forming layer 14 can be formed, not only overlying semiconductor substrate 12, but also in the divots 20.

In efforts to protect the gate stacks 10 from subsequent wet etch chemistries, a silicon nitride spacer 22 typically is formed about sidewalls of the gate stack. However, while the silicon nitride spacers protect the sidewalls of the gate stacks 10, portions 24 of the first gate stack-forming layer in the divots can still be exposed. During subsequent processing, when exposed to one or more wet etch chemistries that can etch the high-k dielectric, the metal-gate-forming material, or both, such as, for example, sulfur peroxide, aluminum peroxide, or hydrofluoric acid, the exposed portions 24 of the gate stack-forming layer 14 in the divots may be etched and provide an etchant flow path for the etchant to attack the first gate stack-forming layer 14 underlying the second gate stack-forming layer 16, as illustrated in FIG. 2. This etching can create a void 26 underlying the second gate stack-forming layer 16 of the gate stacks 10 and thus lead to catastrophic failure of subsequently-formed transistors comprising such void-containing gate stacks.

Accordingly, it is desirable to provide methods for fabricating semiconductor devices, which methods protect gate stacks comprising high-k dielectrics and/or metal gate-forming materials during subsequent wet etch processing. In addition, it is desirable to provide semiconductor devices fabricated from such methods. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for protecting gate stacks during fabrication of semiconductor devices and semiconductor devices fabricated from such methods are provided. In accordance with one exemplary embodiment of the present invention, a method for fabricating a semiconductor device comprises providing a semiconductor substrate having an active region and a shallow trench isolation region having a divot. An epitaxial layer is formed on the active region of the semiconductor substrate to define a lateral overhang portion in the divot at an interface of the active region and the shallow trench isolation region. A gate stack is formed comprising a first gate stack-forming layer overlying the semiconductor substrate. The first gate stack-forming layer comprises a non-conformal layer of metal gate-forming material. The lateral overhang portions induce thereat a thinned break portion in the non-conformal layer. After the step of forming the gate stack, a first portion of the non-conformal layer of metal gate-forming material is in the gate stack and a second portion is exposed with the thinned break portion at least partially isolating the first and second portions during subsequent etch chemistries.

In accordance with another exemplary embodiment of the present invention, a method for fabricating a semiconductor device including a semiconductor substrate having an active region and a shallow trench isolation region having a divot comprises forming an epitaxial layer on a semiconductor substrate having sidewalls to define lateral overhang portions thereof. A first gate stack-forming layer is formed overlying the semiconductor substrate. The first gate stack-forming layer comprises a non-conformal layer of metal gate-forming material having a thinned break portion overlying the lateral overhang portions. A second gate stack-forming layer is formed overlying the first gate stack-forming layer. The first gate stack-forming layer and the second gate stack-forming layer are etched to form a gate stack, wherein, after the step of etching, a first portion of the non-conformal layer of metal gate-forming material underlies the second-gate stack-forming layer and a second portion of the non-conformal layer of metal gate-forming material is exposed. The thinned break portion of the non-conformal layer of metal gate-forming material is between the first and second portions to at least partially isolate the first portion from the second portion during subsequent etch chemistries.

In accordance with a further exemplary embodiment of the present invention, a semiconductor transistor device comprises a semiconductor substrate having an active region and a shallow trench isolation region with an epitaxial layer on the active region defining a lateral overhang portion at an interface of the active region and the shallow trench isolation region. A gate stack overlies the semiconductor substrate. The gate stack comprises a first gate stack-forming layer and a second gate stack-forming layer. The first gate stack-forming layer comprises a non-conformal layer of metal gate-forming material.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 6:
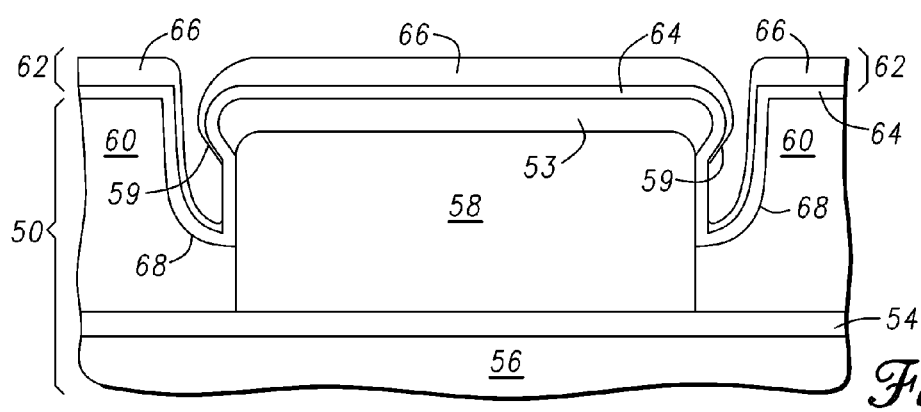
Figure 7:
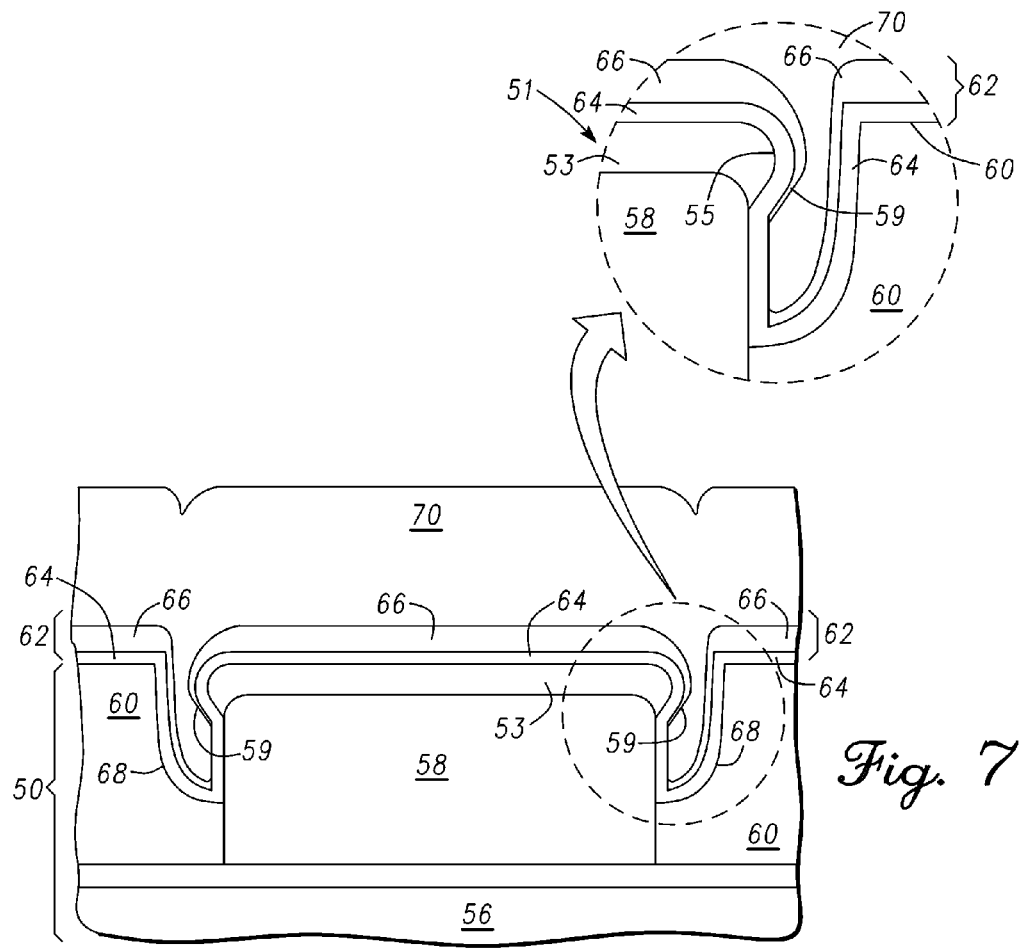
Figure 8:
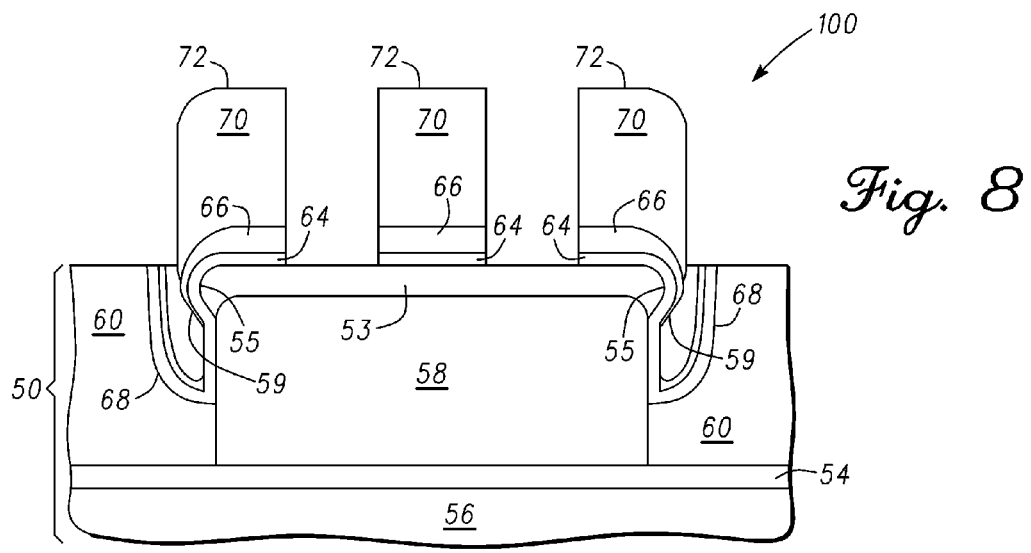
Figure 9:
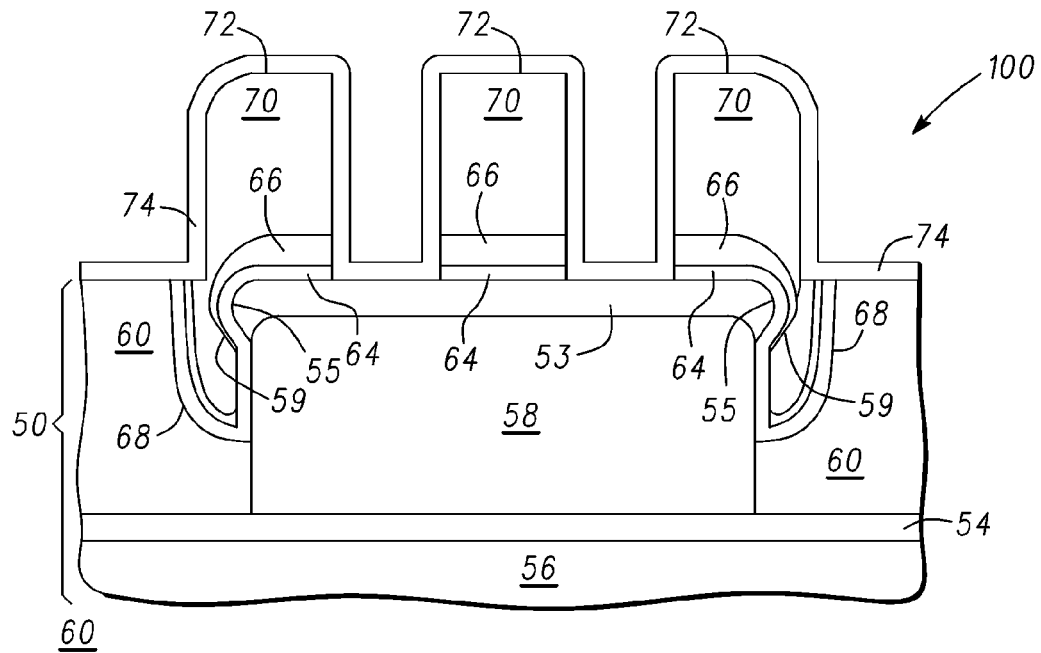
Figure 10:
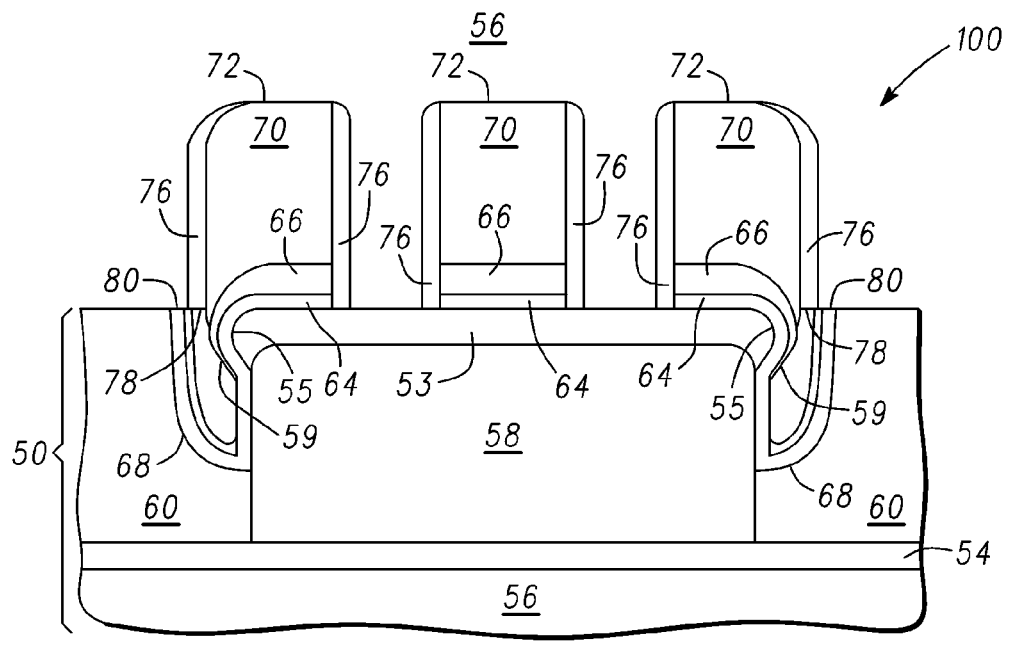

FIGS. 3-10 illustrate, in cross section, methods for protecting gate stacks of MOS transistors, particularly gate stacks comprising high-k dielectrics and metal gate-forming material, during subsequent wet etch processing used to form a semiconductor device 100 (FIGS. 8-10). The various embodiments of the methods utilize an epitaxial layer on an active region of a semiconductor substrate to form a lateral overhang portion at an interface of the active region and a shallow trench isolation region of the semiconductor substrate with a non-conformal layer of metal gate-forming material directionally deposited overlying the semiconductor substrate to form a thinned break portion of the non-conformal layer just below the lateral overhang portion so that, after the gate stack is formed, the thinned break portion at least partially isolates exposed metal gate-forming material from the metal gate-forming material of the gate stack. Wet etch chemistries used during subsequent processing either do not have an etchant flow path or have only a restricted etchant flow path through which to attack the metal gate-forming material of the gate stack itself.

Various steps in the manufacture of MOS components are well known and so, in the interest of brevity, many conventional steps will only be mentioned briefly herein or will be omitted entirely without providing the well known process details. As used herein, the term "MOS transistor" properly refers to a device having a gate electrode formed of a metal-comprising material and an oxide gate insulator, although it is understood that the term may also be used to refer to any semiconductor device that includes a conductive gate electrode (whether metal or other conductive material) that is positioned over a gate insulator (whether oxide or other insulator) which, in turn, is positioned over a semiconductor substrate.

Figure 1:
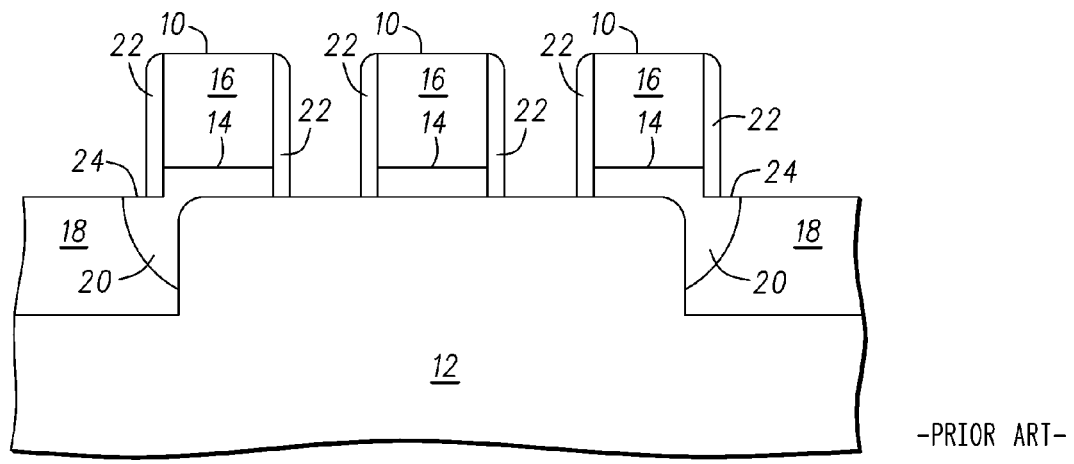
FIG. 1 is a schematic, cross-sectional view of conventional gate stacks comprised of a first gate stack-forming layer and an overlying second gate stack-forming layer with an exposed portion of the first gate stack-forming layer disposed in divots.
Figure 2:
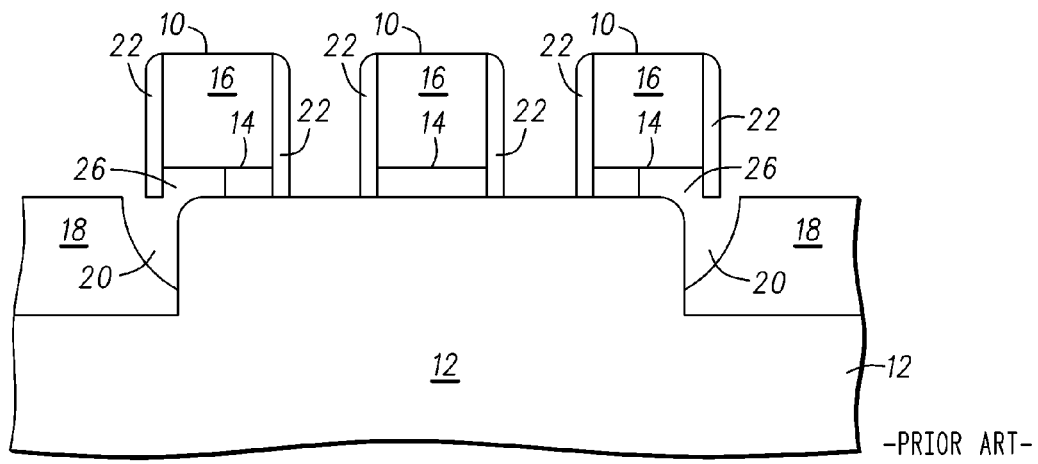
FIG. 2 is a schematic, cross-sectional view of the gate stacks of FIG. 1 with voids underlying the second gate stack-forming layer.
Figure 3:
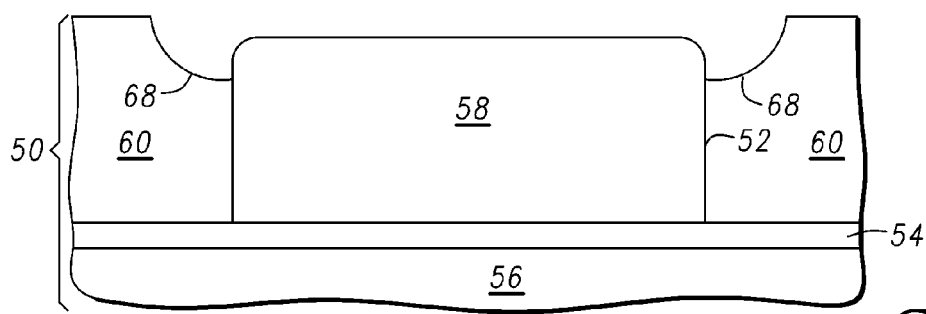
FIGS. 3-10 are schematic, cross-sectional views of methods for forming semiconductor devices, which methods protect the gate stacks during subsequent wet etch processing in accordance with an exemplary embodiment of the present invention.

Referring to FIG. 3, in accordance with one exemplary embodiment, the method includes the step of providing a semiconductor substrate 50. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may be a thin layer 52 of silicon on an insulating layer 54 (commonly know as silicon-on-insulator or SOI) that, in turn, is supported by a carrier wafer 56. At least a portion 58 of the silicon substrate is impurity doped, for example by forming N-type well regions and/or P-type well regions for the fabrication of P-channel MOS transistors and N-channel MOS transistors, respectively. P-channel MOS transistors are referred to herein as as "PFETs" and N-channel MOS transistors are referred to herein as "NFETs", each having active regions. The term "active region" is intended to mean part of a transistor structure through which carriers are designed to flow. The active region includes a channel region, a source region, a drain region, a source/drain region, or any combination thereof for one or more transistor structures (not shown). The semiconductor substrate 50 may comprise shallow trench isolation (STI) regions 60 used to electrically isolate regions of the semiconductor substrate. As mentioned above, during fabrication of STI regions 60, divots 68 may form at the interface of the STI region 60 and the active region of the semiconductor substrate 50. As used herein a "divot" is a void or cavity formed as a result of exposure to etching chemistries during the shallow trench isolation (STI) and subsequent processing.

Figure 4:
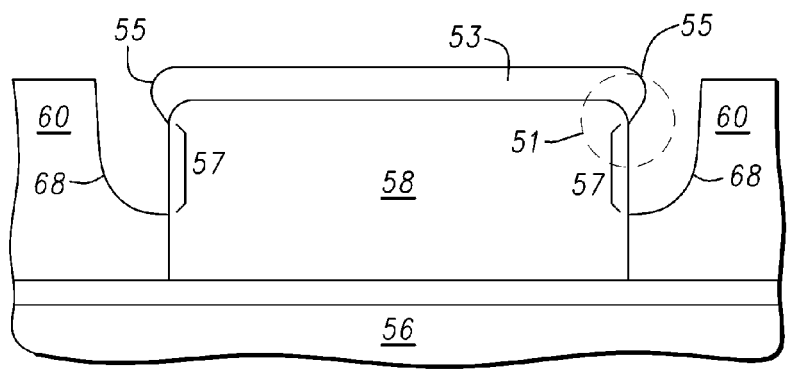

In accordance with an exemplary embodiment of the present invention, as shown in FIG. 4, after formation of the STI but before formation of the gate stack 72, the method includes the step of forming an epitaxial layer 53 by epitaxial growth on the active region of the semiconductor substrate to form lateral overhang portions 55 on the sidewalls of the semiconductor substrate at an active area/STI interface 51 for purposes as described hereinafter. The lateral overhang portions are formed by lateral growth of the epitaxial layer. This lateral growth can be modulated by the epitaxial process conditions (i.e., pressure, temperature, flow rates), crystal orientation of the underlying semiconductor material, and the rotation. In an exemplary embodiment, the semiconductor substrate may have (100), (110), or (111) crystal orientation, preferably (100). In addition, the semiconductor substrate may be rotated, preferably by 45 degrees.

For a PFET active region, in a preferred embodiment of the present invention, the epitaxial layer 53 comprises a channel Silicon Germanium (cSiGe) epitaxial layer and epitaxial growth conditions include using a precursor material comprising dichlorosilane ($SiH_2Cl_2$) (DCS) and $GeH_4$ at a temperature between about 500 to about 650° C., preferably about 600° C., and at a pressure between about 5 torr and about 50 torr, preferably about 10 torr. Growth of the cSiGe epitaxial layer can be performed via known selective epitaxy processes. The cSiGe epitaxial layer may comprise from about 15 to about 40 atomic percent germanium The epitaxial layer may be epitaxially grown to have a thickness from about 4 nm to about 15 nm, preferably about 10 nm. The atomic percent of germanium and the thickness of the cSiGe layer can be varied as desired.

While the use of a DCS precursor material has been described, the invention is not so limited. Other silicon precursor materials such as $SiH_4$, $SiHCl_3$ or $SiCl_4$ may also be used with varying epitaxial growth conditions to grow an epitaxial layer having the desired morphology of lateral overhang portions at the PFET active region/shallow trench isolation region interface. In addition, while the use of a cSiGe epitaxial layer has been described, the invention is not so limited. For example, a pure silicon layer can be epitaxially grown either directly on the SOI or on the cSiGe with the desired lateral overhang formed by the pure silicon epitaxial layer and/or the cSiGe epitaxial layer. In addition, the cSiGe or silicon layers can be doped with impurities such as boron, phosphorus, carbon, or the like as known in the art.

For NFET active regions, a silicon epitaxial layer having a thickness of from about 4 nm to about 15 nm may be formed instead of the cSiGe epitaxial layer. The silicon epitaxial layer can be doped with impurities such as boron, phosphorus, carbon, or the like as known in the art.

After the step of forming the epitaxial layer, a wet etch, typically using hydrofluoric acid (HF), may be performed. Such wet etching may be done to remove an nFET hard mask and perform cleans before deposition of the gate insulator material as hereinafter described. Such wet etch chemistries further etch the divots 68 as shown in FIG. 4 creating shadow areas 57 on the sidewalls of the semiconductor substrate under the lateral overhang portions.

Figure 5:
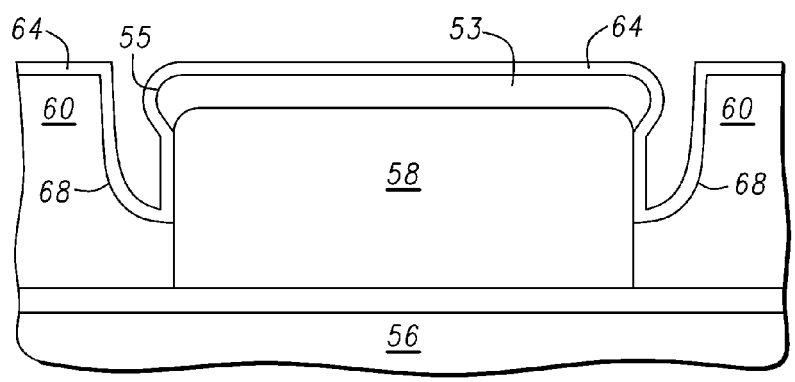

Next, as illustrated in FIG. 5, a conformal layer of gate insulator material 64 is deposited overlying the semiconductor substrate 50, but also within the divots 68. The gate insulator material 64 can be a layered combination of thermally grown silicon dioxide or, alternatively, a deposited insulator such as a silicon oxide, silicon nitride, silicon oxynitride or the like and a deposited high dielectric constant insulator ("high-k dielectric"). As used herein, the terms "high dielectric constant insulator" and "high-k dielectric" refer to insulating materials having a dielectric constant greater than silicon dioxide. Typical high-K dielectrics are susceptible to etching by hydrofluoric acid (HF). Examples of high-k dielectrics include hafnium silicon oxynitride (HfSiON), hafnium zirconium oxide (HfZrOx), zinc dioxide ($ZnO_2$), and the like, and combinations thereof. However, the etch resistance of high-K dielectrics to wet etch chemistries used in subsequent processing may be improved by nitridation of the high-K dielectric followed by an anneal, typically at a temperature of about 1000° C. Deposited insulators can be deposited, for example, by, low pressure chemical vapor deposition (LPCVD), plasma-enhanced chemical vapor deposition (PECVD), metal-Organic chemical vapor deposition (MOCVD) or atomic layer deposition (ALD). Gate insulator material 64 preferably has a thickness of about 1-10 nm, although the actual thickness can be determined based on the application of the transistor in the circuit being implemented. In the preferred embodiment of the present invention, the gate insulator material 64 is substantially etch resistant to such standard wet etch chemistries using sulfur peroxide, ammonium peroxide, or hydrofluoric acid.

Next, as shown in FIG. 6, a non-conformal layer of metal gate-forming material 66 is deposited over the conformal layer of gate insulator material including into the divots 68. The metal gate-forming material 66 may be formed of lanthanum (La) or lanthanum alloys, aluminum (Al) or aluminum alloys, magnesium (Mg) or magnesium alloys, titanium-based materials such as titanium nitride (TiN) or titanium aluminum nitride (TiAlN), tantalum-based materials such as tantalum nitride (TaN), tantalum aluminum nitride (TaAlN), or tantalum carbide ($Ta_2C$), or the like. The metal gate-forming material 66 has a high etch rate and is susceptible to wet etch chemistries such as, for example, sulfur peroxide, aluminum peroxide, or hydrofluoric acid.

The directional deposition of the layer of metal gate-forming material 66 forms a thicker layer over the top and shoulders of the semiconductor substrate and a thinner layer on the sidewalls of the semiconductor substrate, with the layer thinning even more just below the lateral overhang portions. The directional deposition ideally deposits only perpendicular to the layer plane. This avoids deposition in the shadow areas on the sidewalls of the semiconductor substrate under the lateral overhang portions. The layer of metal gate-forming material may be deposited using physical vapor deposition (PVD), pulsed laser deposition (PLD) and sputtering processes or other known physical deposition process. These physical depositional processes are directional and therefore the directional deposition of the layer of metal gate-forming material is a non-conformal deposition.

As a result of such thinning, the non-conformal layer of metal gate-forming material 66 may "break", i.e., be discontinuous just below the lateral overhang portions. As used herein, "thinned break portion" refers to the portion 59 of the non-conformal layer of metal gate-forming material that thins out just below the lateral overhang portions, including to the point of breakage. The non-conformal layer of metal gate-forming material is typically deposited to a thickness from about 2 nm to about 10 nm over the top and shoulders of the semiconductor substrate, preferably about 4 nm, and thinning to between about 0 nm and about 1 nm, preferably about 0.5 nm along the sidewalls of the semiconductor substrate. At "0 nm", the non-conformal layer is broken. While the morphology of the non-conformal layer remains constant, i.e., thicker on the top and shoulders of the semiconductor substrate and thinner on the sidewalls and even thinner just below the lateral overhang portions, the thickness of the non-conformal layer of metal gate-forming material may vary depending on the application of the transistor in the circuit being implemented. The layered combination of the conformal layer of gate insulator material 64 and the non-conformal layer of metal gate-forming material 66 form a first gate stack-forming layer 62, as shown in FIG. 6.

Next, as shown in FIG. 7, a second gate stack-forming layer 70 is deposited overlying the first gate stack-forming layer 62. Second gate stack-forming layer 70, having a composition different from that of the first gate stack-forming layer, may comprise electrically conductive gate electrode-forming materials such as metals or, preferably, comprises polycrystalline or amorphous silicon. The second gate stack-forming layer will hereinafter be referred to as polycrystalline silicon, although those of skill in the art will recognize that other materials can also be employed. Second gate stack-forming layer 70 may be formed by itself or with appropriate impurity doping that can set the necessary resistance of the gate electrode. If the second gate stack-forming layer is polycrystalline or amorphous silicon, that material is typically deposited to a thickness of about 20 to about 100 nm and preferably to a thickness of about 40 nm. The layer of polycrystalline or amorphous silicon can be deposited as silicon that is doped in-situ or can be deposited as undoped silicon and subsequently impurity doped by ion implantation.

In accordance with one embodiment of the invention, a layer of hard mask material (not shown) is deposited onto the polycrystalline silicon to aid in the subsequent patterning and etching of the first and second gate stack-forming layer. The hard mask material can be, for example, a layer of silicon nitride having a thickness of about 3 to about 20 nm. The silicon nitride can be deposited, for example, by LPCVD by the reaction of dichlorosilane and ammonia. The first and second gate stack-forming layers then are photolithographically patterned and etched to form gate stacks 72 overlying the semiconductor substrate 50 as shown in FIG. 8.

The method continues, in accordance with an exemplary embodiment of the present invention, with the deposition of a first spacer material 74 overlying the semiconductor substrate 50 and gate stacks 72, as illustrated in FIG. 9. The first spacer material 74 comprises a material that does not adversely react with the gate insulator material 64 and/or the metal gate-forming material 66. Preferably, the first spacer material 74 comprises silicon nitride. Referring to FIG. 10, sidewall spacers 76 then can be formed in conventional manner by the anisotropic etching of first spacer material 74. The anisotropic etching can be done, for example, by reactive ion etching (RIE). The RIE process chemistry used depends on the material selected for first sidewall material 74 and may be based on, for example, $CH_2F_2$, $CHF_3$, $CF_4$ or $SF_6$, for silicon nitride. In one exemplary embodiment, the first spacer material 74 is deposited to a thickness such that, upon anisotropic etching, sidewall spacers 76 have a thickness in the range of about 2 nm to about 9 nm. As illustrated in FIG. 10, sidewall spacers 76 cover a first portion 78 of first gate stack-forming layer 62 in divots 68, leaving a second portion 80 exposed, that is, second portion 80 does not underlie the gate stacks or sidewall spacers 76. As used herein, "exposed metal gate-forming material" refers to the metal gate-forming material in the divots, in both the first and second portions 78 and 80 of the first gate stack-forming layer 62. The thinned break portion 59 is between the exposed metal gate-forming material and the metal gate-forming material in the gate stack.

After formation of the sidewall spacers 76, during subsequent processing in the fabrication of the semiconductor device, the exposed metal gate-forming material is exposed to liquid chemistries, such as solvents and/or aqueous solutions, used to remove disposable materials. For example, sulfur peroxide is commonly used during photolithography to strip photoresist from semiconductor substrates, ammonium peroxide is commonly used to clean materials off a semiconductor device, and hydrofluoric acid is commonly used as a pre-clean for metal silicide and to remove low temperature and other oxides. When exposed to such etch chemistries, the etchant would typically etch the exposed metal gate-forming material in the divots and continue unimpeded to disadvantageously etch the metal-gate forming material in the gate stack, conceivably until the non-conformal layer 66 was removed. However, the thinned break portion 59 of the non-conformal layer of metal gate-forming material 66 at least partially blocks or isolates the metal gate-forming material underlying the second gate stack forming layer from the exposed metal gate-forming material in the divots, i.e., the thinned break portion disrupts the etchant flow path. Partial isolation and partial blocking result when the non-conformal layer of metal gate-forming material is thinned so that it resists etchant flow and complete isolation and blocking result if thinning results in a discontinuous or "broken" non-conformal layer. In this regard, the metal gate-forming material 66 of the first gate stack-forming layer 62 that is under the gate stack 72 is protected from the wet etch chemistries used in processing subsequent to sidewall spacer formation.

Accordingly, methods are provided for the protection of gate stacks of MOS transistors, particularly gate stacks comprising high-k dielectrics and/or metal gate-forming material, during subsequent wet etch processing used to form semiconductor devices. Semiconductor devices formed of such methods also are provided. The various embodiments utilize an epitaxial layer of the semiconductor substrate to form lateral overhang portions on the sidewalls thereof. Directional deposition of a non-conformal layer of metal gate-forming material at the lateral overhang portions and no deposition thereof on the sidewalls under the lateral overhang portions results in the thinned break portion. The thinned break portion restricts or blocks the etchant path during subsequent wet etch chemistries so that etchants will not be able undercut the metal gate-forming material beyond the sidewalls of the semiconductor substrate. Thus, the metal gate-forming material underlying the second gate stack forming layer is preserved.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor device, the method comprising the steps of:

providing a semiconductor substrate having an active region and a shallow trench isolation region having a divot;

forming an epitaxial layer on the active region of the semiconductor substrate to define a lateral overhang portion in the divot at an interface of the active region and the shallow trench isolation region; and forming a gate stack comprising a first gate stack-forming layer overlying the semiconductor substrate, wherein the step of forming the gate stack comprises directionally depositing a non-conformal layer of metal gate-forming material forming a thinned break portion thereof just below the lateral overhang portion; wherein after the step of forming the gate stack, a first portion of the non-conformal layer of metal gate-forming material is in the gate stack and a second portion is exposed with the thinned break portion at least partially isolating the first and second portions.

2. The method of claim 1, wherein the step of providing the semiconductor substrate comprises providing the semiconductor substrate having a pFET active region and the step of forming the epitaxial layer comprises epitaxially growing a channel Silicon Germanium (cSiGe) epitaxial layer.

3. The method of claim 2, wherein the step of forming the epitaxial layer comprises epitaxially growing the cSiGe epitaxial layer comprising about 15 to about 40 atomic percent germanium.

4. The method of claim 1, wherein the step of providing the semiconductor substrate comprises providing the semiconductor substrate having an nFET active region and the step of forming the epitaxial layer comprises epitaxially growing a silicon epitaxial layer.

5. The method of claim 1, wherein the step of forming the gate stack comprising the first gate stack-forming layer overlying the semiconductor substrate comprises forming the gate stack comprising a gate insulator material and the metal gate-forming material which overlies the gate insulator material.

6. The method of claim 5, wherein the step of forming the gate stack comprising the gate insulator material comprises forming the gate stack using a substantially etch resistant gate insulator material.

7. The method of claim 5, wherein the step of forming the gate stack comprising the metal gate-forming material comprises forming the gate stack using a material selected from the group consisting of lanthanum, lanthanum alloys, aluminum, aluminum alloys, magnesium, magnesium alloys, titanium-based materials, and tantalum-based materials.

8. The method of claim 1, wherein the step of forming the gate stack comprising the first gate stack-forming layer overlying the semiconductor substrate comprises the steps of:

forming the first gate stack-forming layer overlying the semiconductor substrate;

forming a second gate stack-forming layer overlying the first gate stack-forming layer, wherein the second gate stack-forming layer has a composition different from the first gate stack-forming layer; and etching the first gate stack-forming layer and the second gate stack-forming layer to form the gate stack.

9. The method of claim 8, wherein the step of forming the second gate stack-forming layer comprises depositing polycrystalline or amorphous silicon overlying the first gate stack-forming layer.

10. A method for fabricating a semiconductor device including a semiconductor substrate having an active region and a shallow trench isolation region having a divot, the method comprising the steps of:

forming an epitaxial layer on the active region of the semiconductor substrate to define lateral overhang portions thereof;

forming a first gate stack-forming layer overlying the semiconductor substrate comprising directionally depositing a non-conformal layer of metal gate-forming material to form a thinned break portion in the divot just below the lateral overhang portions;

forming a second gate stack-forming layer overlying the first gate stack-forming layer; and etching the first gate stack-forming layer and the second gate stack-forming layer to form a gate stack, wherein, after the step of etching, a first portion of the non-conformal layer of metal gate-forming material underlies the second-gate stack-forming layer and a second portion of the non-conformal layer of metal gate-forming material is exposed with the thinned break portion of the non-conformal layer of metal gate-forming material therebetween to at least partially isolate the first portion from the second portion during subsequent etch chemistries.

11. The method of claim 10, wherein the step of forming the epitaxial layer on the semiconductor substrate comprises providing the semiconductor substrate having a pFET active region and the step of forming the epitaxial layer comprises epitaxially growing a channel Silicon Germanium (cSiGe) epitaxial layer.

12. The method of claim 11, wherein the step of forming the epitaxial layer comprises epitaxially growing the cSiGe epitaxial layer comprising about 15 to about 40 atomic percent germanium.

13. The method of claim 10, wherein the step of forming the epitaxial layer on the semiconductor substrate comprises providing the semiconductor substrate having an nFET active region and epitaxially growing a silicon epitaxial layer on the nFET active region.

14. The method of claim 10, wherein the step of forming a first gate stack-forming layer comprises forming a portion of the first gate stack-forming layer in the divot.

15. The method of claim 10, wherein the step of forming the first gate stack-forming layer comprising the non-conformal layer of metal-gate forming material comprises forming the non-conformal layer overlying a substantially etch resistant gate insulator material.

16. The method of claim 10, wherein the step of forming the first gate stack-forming layer comprising a non-conformal layer of metal gate-forming material comprises forming the first gate stack-forming layer using a material selected from the group consisting of lanthanum, lanthanum alloys, aluminum, aluminum alloys, magnesium, magnesium alloys, titanium-based materials, and tantalum-based materials.

17. The method of claim 10, wherein the step of forming a second gate stack-forming layer comprises forming polycrystalline or amorphous silicon overlying the first gate stack-forming layer.

\* \* \* \* \*